US011621316B1

(12) United States Patent
Choi et al.

(10) Patent No.: US 11,621,316 B1
(45) Date of Patent: Apr. 4, 2023

(54) MICRO OLEDS HAVING NARROW BEZEL

(71) Applicant: META PLATFORMS TECHNOLOGIES, LLC, Menlo Park, CA (US)

(72) Inventors: Min Hyuk Choi, San Jose, CA (US); Cheonhong Kim, Mountain View, CA (US); Richard Han Soo Cho, Fremont, CA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 0 days.

(21) Appl. No.: 17/580,514

(22) Filed: Jan. 20, 2022

Related U.S. Application Data

(63) Continuation of application No. 16/860,030, filed on Apr. 27, 2020, now Pat. No. 11,244,996.

(51) Int. Cl.
  *H01L 27/12* (2006.01)
  *H01L 27/32* (2006.01)
  *H01L 51/00* (2006.01)
  *G06F 3/041* (2006.01)
  *H01L 21/768* (2006.01)

(52) U.S. Cl.
  CPC ...... *H01L 27/3276* (2013.01); *H01L 27/3288* (2013.01); *H01L 51/0097* (2013.01); *G06F 3/0412* (2013.01); *H01L 21/76898* (2013.01); *H01L 27/323* (2013.01)

(58) Field of Classification Search
  CPC ............ H01L 27/3276; H01L 27/3288; H01L 27/3251; H01L 27/3253; H01L 27/3244; H01L 27/3262; H01L 2227/323; H01L 51/0097; H01L 51/56; G02F 1/13452; G06F 1/1637
  See application file for complete search history.

(56) References Cited

U.S. PATENT DOCUMENTS

| | | | |
|---|---|---|---|
| 9,153,629 B2 | 10/2015 | Lee | |
| 9,543,354 B2 | 1/2017 | Rudmann et al. | |
| 11,158,690 B1* | 10/2021 | Choi | G06F 3/147 |
| 2005/0237280 A1 | 10/2005 | Oh et al. | |
| 2013/0148072 A1 | 6/2013 | Jang et al. | |
| 2018/0211596 A1* | 7/2018 | Gu | H01L 27/3244 |
| 2019/0006427 A1 | 1/2019 | Lu et al. | |

(Continued)

FOREIGN PATENT DOCUMENTS

| | | |
|---|---|---|
| CN | 107195801 A | 9/2017 |
| CN | 107452769 A | 12/2017 |

(Continued)

OTHER PUBLICATIONS

International Preliminary Report on Patentability for International Application No. PCT/US2021/023367, dated Oct. 27, 2022, 7 pages.

*Primary Examiner* — Xuemei Zheng

(74) *Attorney, Agent, or Firm* — Greenberg Traurig, LLP

(57) ABSTRACT

A device such as a micro-OLED includes a display element having a display active area disposed over a silicon backplane and a display driver integrated circuit (DDIC) electrically coupled to the display element through at least one contact that extends through the silicon backplane. Through silicon via (TSV) technology may be used to form the contacts. A chip-on-flex architecture may be used to orient and attach the DDIC to the silicon backplane.

20 Claims, 9 Drawing Sheets

(56) References Cited

U.S. PATENT DOCUMENTS

| | | |
|---|---|---|
| 2019/0108816 A1 | 4/2019 | Peana et al. |
| 2019/0137766 A1 | 5/2019 | Jang et al. |
| 2019/0164478 A1 | 5/2019 | Kim et al. |
| 2019/0312224 A1 | 10/2019 | Oshige |
| 2020/0135821 A1 | 4/2020 | Seo |
| 2020/0251049 A1* | 8/2020 | Morris .................... G06F 1/163 |
| 2021/0056893 A1 | 2/2021 | Wei et al. |
| 2022/0020927 A1* | 1/2022 | Zhang ................ H01L 27/3276 |

FOREIGN PATENT DOCUMENTS

| | | | |
|---|---|---|---|
| CN | 108155221 A | * | 6/2018 |
| CN | 109390373 A | | 2/2019 |
| CN | 110047899 A | | 7/2019 |

\* cited by examiner

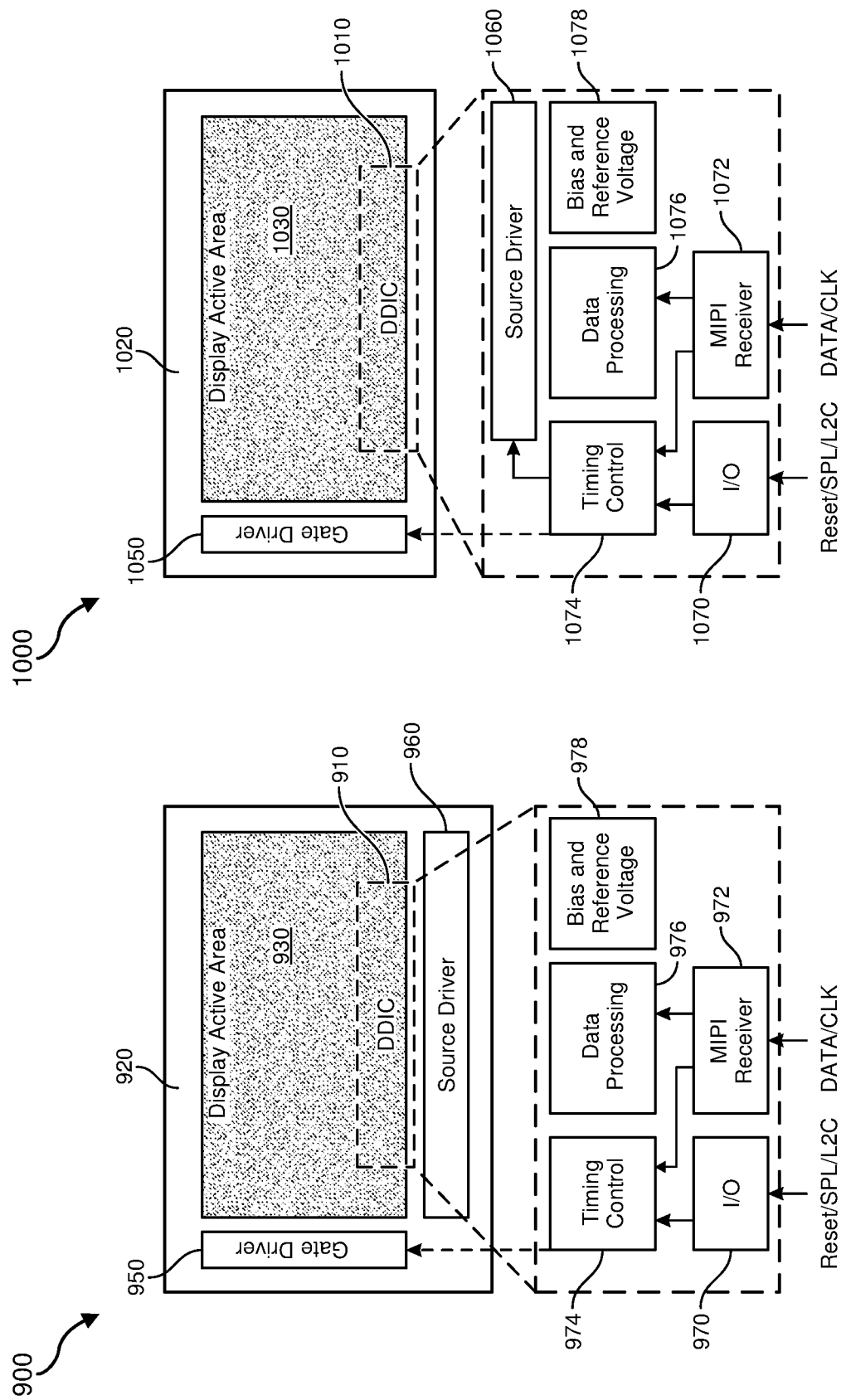

MICRO OLEDS HAVING NARROW BEZEL

CROSS REFERENCE TO RELATED APPLICATION

This application is a Continuation of U.S. Provisional Application No. 16/860,030, filed Apr. 27, 2020, the disclosure of which is incorporated, in its entirety, by this reference.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

FIG. 9 depicts a micro-OLED package with various control circuit elements mounted over a back face of a silicon backplane opposite to the display active area according to some embodiments.

FIG. 10 depicts a micro-OLED package with various control circuit elements mounted over a back face of a silicon backplane opposite to the display active area according to further embodiments.

Figure 1:
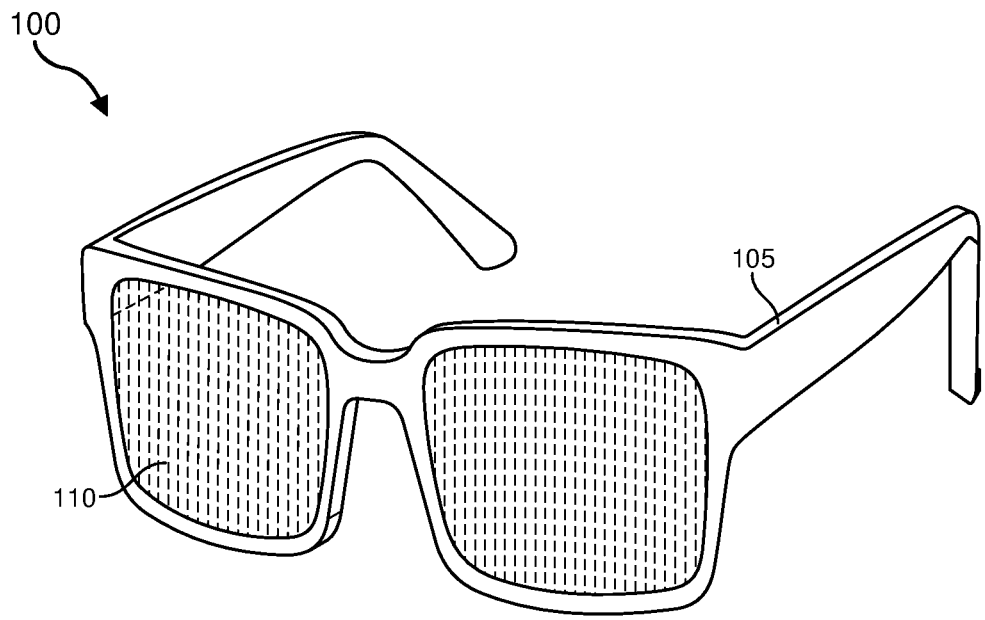
FIG. 1 is a diagram of a head-mounted display (HMD) that includes a near-eye display (NED) according to some embodiments.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

Optical displays are ubiquitous in emerging technologies, including wearable devices, smart phones, tablets, laptops, desktop computers, and other display systems. Many display systems used in such technologies are based on light emitting diodes (LEDs), including organic light emitting diodes (OLEDs). The present disclosure relates generally to display systems and, more specifically, to organic light emitting diode (OLED)-based displays, including micro OLED-based displays and their methods of manufacture.

In accordance with various embodiments, a display system may include a display panel having an array of individual LED display elements defining an active area. One or more LED display elements can be grouped to form pixels. Each of the plurality of pixels may include an organic light emitting diode (OLED) and suitable control circuitry configured to generate and distribute control signals to selectively illuminate the pixels to project an image.

The display system may further include a semiconducting backplane that underlies the display panel. The backplane may provide structural support for the LED display elements and provide electrical connections to transmit the control signals to the light emitting diodes. As will be appreciated, integration of the LED display elements with the backplane and control circuitry can affect pixel-level interconnects, including the size and density of a pixel array, and ultimately the quality, performance, and cost of the display system.

According to certain embodiments, the control circuitry may include a display driver integrated circuit (DDIC), which may be configured to apply current to selected diodes, determining which pixels get turned on and which pixels remain off. In some embodiments, the brightness of each pixel may be proportional to the amount of applied current.

In many comparative OLED display architectures, the control circuitry is mounted over a front surface of the backplane adjacent to the display panel. With such a layout, the control circuitry may occupy a region of the backplane at the expense of the display active area. Notwithstanding recent developments, it would be advantageous to provide improved integration and packaging schemes for the economical manufacture of large area, performance-enhanced light emitting diode-based displays.

Disclosed herein are OLED display structures that include an active display panel located over a front face of a silicon backplane and a display driver integrated circuit (DDIC) located over a back face of the silicon backplane opposite to the front face where electrical connections between the active display panel and the display driver integrated circuit are made through the backplane. The backside placement of the DDIC enables a greater percentage of the silicon's front face to be dedicated to the active display panel, which may correlate to a significant improvement in material utilization and substantial cost savings. The instant approach preserves front-side area of the silicon chip for the device active area and thus may enable a larger active area for a given chip size.

Display driver integrated circuits (DDICs), which may also be referred to herein as driver ICs, may receive image data and deliver analog voltages or currents to activate one or more pixels within the display. As will be appreciated, driver ICs may include gate drivers and source drivers. In accordance with various embodiments, a gate driver may refer to a power amplifier that accepts a low-power input from a controller IC and produces a high-current drive input for the gate of a transistor, such as an insulated gate bipolar transistor (IGBT) or power metal-oxide-semiconductor field effect transistor (MOSFET). In some embodiments, a gate driver may be configured to turn on and off selected transistors within each pixel cell across a horizontal row of the display area. When the transistors are turned on, a source driver may generate voltages that are applied to each pixel cell on that row for data input. In some embodiments, a source driver may be integrated with a digital-to-analog converter (DAC) for generating analog output voltages from digital input data to drive individual pixels.

Individual silicon die used to form a silicon backplane may be cut from a silicon wafer. In the context of material utilization, in one example, 16 die each measuring 32 mm×36 mm may be harvested from a silicon wafer having a diameter of 200 mm. In a comparative architecture where a portion of the available silicon area is reserved for circuit bonding, the available active area per chip may be approximately 960 mm$^2$. On the other hand, with the instant approach, where a greater percentage of the area of a given die may be made available to form the active display, a comparable display active area may be realized using die measuring just 32 mm×33 mm, where 19 such die may be harvested from the same sized wafer.

In some embodiments, the display driver integrated circuit may be attached to a flexible substrate. In certain embodiments, chip-on-flex (COF) or direct bonding methods in conjunction with through silicon via (TSV) technology may be used to secure and electrically connect the DDIC to the active display panel.

According to some embodiments, an LED-based (e.g., OLED-based or micro-OLED-based) device may include a display element having a display active area disposed over a front face of a silicon backplane, and a DDIC mounted over a back face of the silicon backplane and electrically coupled to the display element by contacts that extend through the silicon backplane. According to further embodiments, a display system may include a display element having an LED-containing display active area disposed over a silicon backplane and a DDIC electrically connected to the display active area by at least one through silicon via (TSV) that extends through the silicon backplane, i.e., from the back face to the front face.

As used herein, a through-silicon via (TSV) may, in some embodiments, refer to an electrical connection that passes completely through a silicon substrate, and may be used to connect features located on opposite sides of the substrate. As will be appreciated, TSVs may be implemented as an alternative to wire bonding and flip chip technologies to create 3D microelectronic packages.

Through-silicon vias may be formed by etching or drilling into the silicon substrate to form openings that are backfilled with a conductive material. A planarization step such as chemical mechanical polishing (CMP) may be used to remove excess conductive material outside of the via, while the portions of the conductive material remaining within the substrate form the TSVS.

The silicon backplane may include single crystal silicon. The higher carrier mobility of a single crystal silicon backplane (i.e., relative to glass, polymer, or even polycrystalline semiconductors) and the attendant improvements in device operating speed may enable the creation of an increasingly complex data selection interface between the display elements and the display driver circuitry. A higher density data selection interface may enable higher pixel densities within the display active area and higher quality images.

A method of forming a display system may include forming a display element comprising an LED-containing display active area over a silicon backplane, forming a metallized via that extends entirely through the silicon backplane, and forming a display driver integrated circuit (DDIC) over the silicon backplane opposite to the display element, where the display driver integrated circuit is electrically connected to the display active area through the metallized via.

As will be appreciated, the LED-based displays described herein may include microLEDs. Moreover, the LED-based displays may include organic LEDs (OLEDS), including micro-OLEDs. The LED-based displays may be incorporated into a variety of devices, such as wearable near-eye displays (NEDs). The disclosed methods and structures may be used to manufacture low cost, high resolution displays having a commercially-relevant form factor (e.g., having one or more lateral dimensions greater than approximately 1.6 inches).

Features from any of the above-mentioned embodiments may be used in combination with one another according to the general principles described herein. These and other embodiments, features, and advantages will be more fully understood upon reading the following detailed description in conjunction with the accompanying drawings and claims.

The following will provide, with reference to FIGS. 1-12, a detailed description of LED devices, systems, and methods of manufacture. The discussion associated with FIGS. 1-3 relates to an example near-eye display (NED). The discussion associated with FIGS. 4-10 includes a description of OLEDs and OLED packaging in accordance with various embodiments. The discussion associated with FIGS. 11 and 12 relates to various virtual reality platforms that may include a display device as described herein.

FIG. 1 is a diagram of a near-eye-display (NED) 100, in accordance with some embodiments. The NED 100 may present media to a user. Examples of media that may be presented by the NED 100 include one or more images, video, audio, or some combination thereof. In some embodiments, audio may be presented via an external device (e.g., speakers and/or headphones) that receives audio information from the NED 100, a console (not shown), or both, and presents audio data to the user based on the audio information. The NED 100 is generally configured to operate as a virtual reality (VR) NED. However, in some embodiments, the NED 100 may be modified to also operate as an augmented reality (AR) NED, a mixed reality (MR) NED, or some combination thereof. For example, in some embodiments, the NED 100 may augment views of a physical, real-world environment with computer-generated elements (e.g., still images, video, sound, etc.).

The NED 100 shown in FIG. 1 may include a frame 105 and a display 110. The frame 105 may include one or more optical elements that together display media to a user. That is, the display 110 may be configured for a user to view the content presented by the NED 100. As discussed below in conjunction with FIG. 2, the display 110 may include at least one source assembly to generate image light to present optical media to an eye of the user. The source assembly may include, e.g., a source, an optics system, or some combination thereof.

It will be appreciated that FIG. 1 is merely an example of a virtual reality system, and the display systems described herein may be incorporated into further such systems. In some embodiments, FIG. 1 may also be referred to as a Head-Mounted-Display (HMD).

Figure 2:
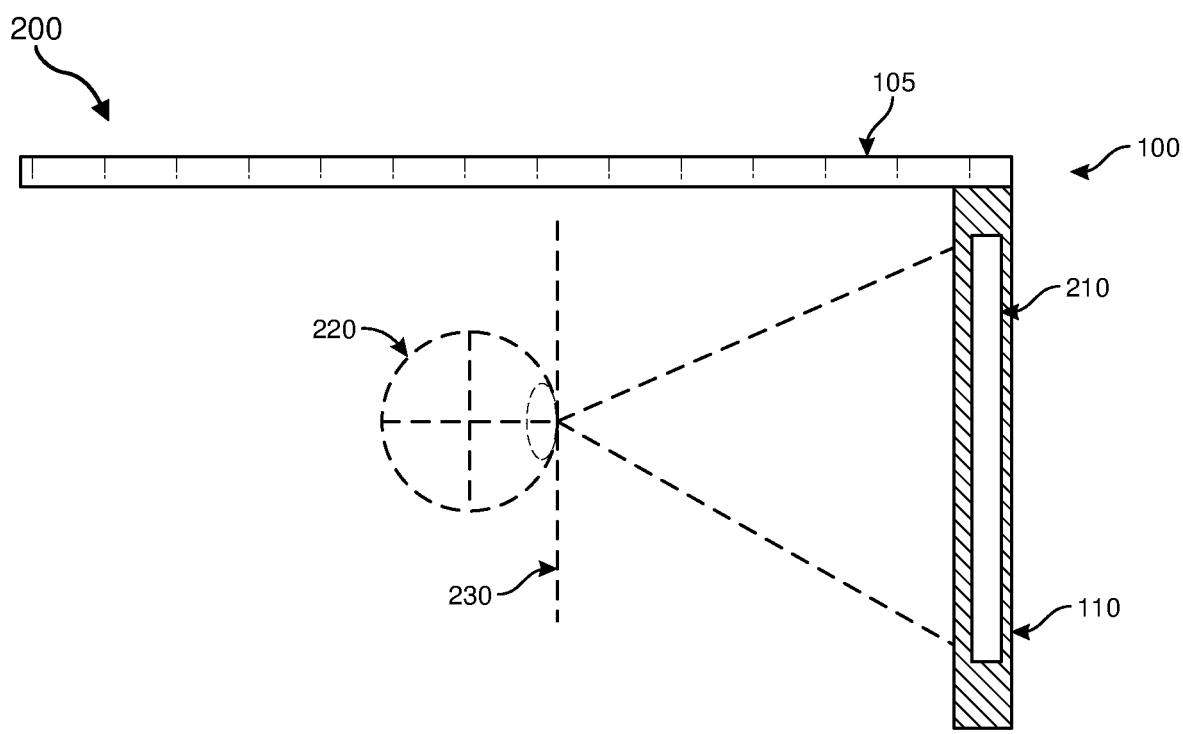
FIG. 2 is a cross-sectional view of the HMD illustrated in FIG. 1 according to some embodiments.

FIG. 2 is a cross section 200 of the NED 100 illustrated in FIG. 1, in accordance with some embodiments of the present disclosure. The cross section 200 may include at least one display assembly 210, and an exit pupil 230. The exit pupil 230 is a location where the eye 220 may be positioned when the user wears the NED 100. In some embodiments, the frame 105 may represent a frame of eye-wear glasses. For purposes of illustration, FIG. 2 shows the cross section 200 associated with a single eye 220 and a single display assembly 210, but in alternative embodiments not shown, another display assembly that is separate from or integrated with the display assembly 210 shown in FIG. 2, may provide image light to another eye of the user.

The display assembly 210 may be configured to direct the image light to the eye 220 through the exit pupil 230. The display assembly 210 may be composed of one or more materials (e.g., plastic, glass, etc.) with one or more refractive indices that effectively decrease the weight and widen a field of view of the NED 100.

In alternate configurations, the NED 100 may include one or more optical elements (not shown) between the display assembly 210 and the eye 220. The optical elements may act to, by way of various examples, correct aberrations in image light emitted from the display assembly 210, magnify image light emitted from the display assembly 210, perform some other optical adjustment of image light emitted from the display assembly 210, or combinations thereof. Example optical elements may include an aperture, a Fresnel lens, a convex lens, a concave lens, a filter, or any other suitable optical element that may affect image light.

In some embodiments, the display assembly 210 may include a source assembly to generate image light to present media to a user's eyes. The source assembly may include, e.g., a light source, an optics system, or some combination thereof. In accordance with various embodiments, a source assembly may include a light-emitting diode (LED) such as an organic light-emitting diode (OLED).

Figure 3:
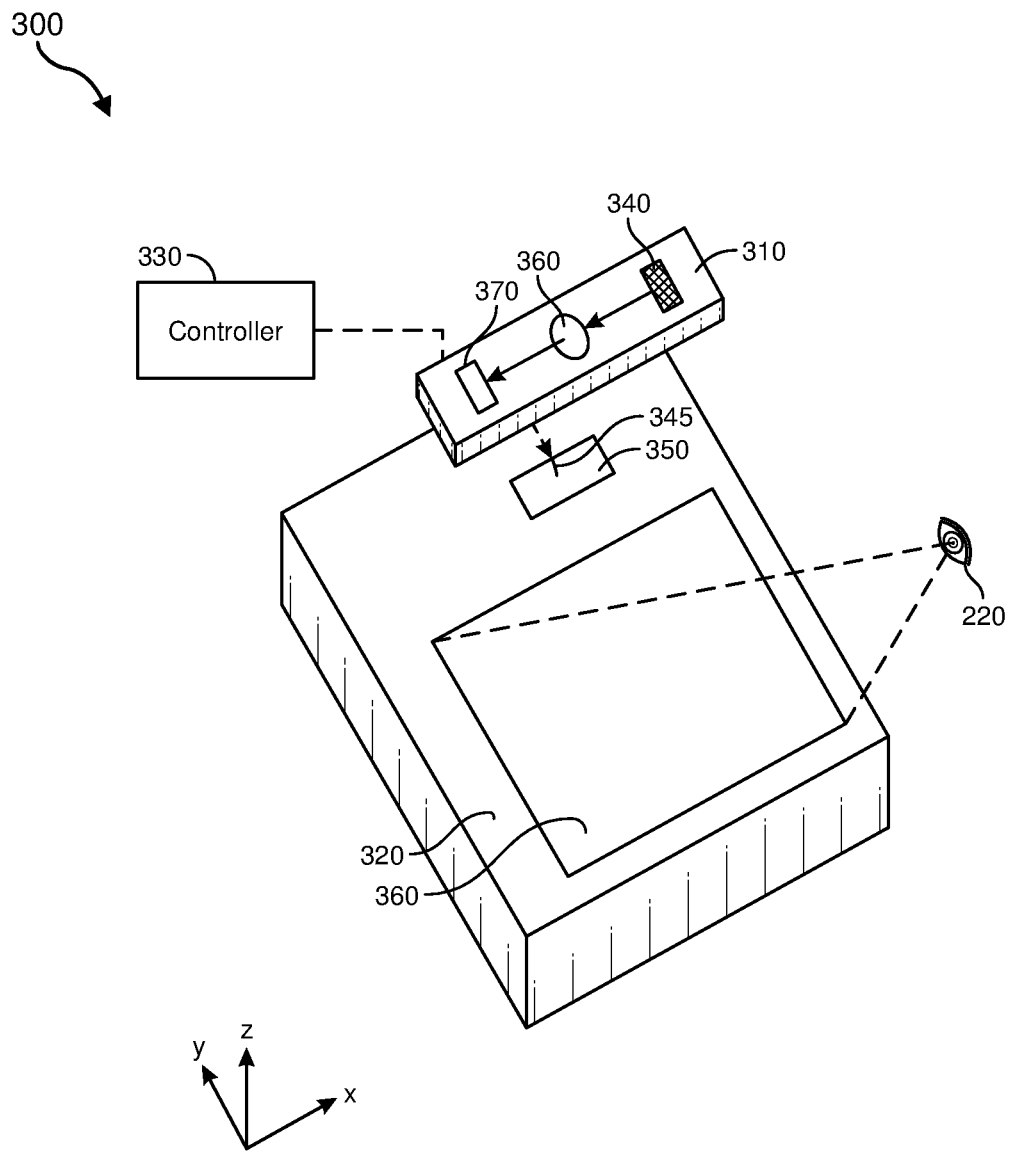
FIG. 3 illustrates an isometric view of a waveguide display in accordance with various embodiments.

FIG. 3 illustrates an isometric view of a waveguide display 300 in accordance with some embodiments. The waveguide display 300 may be a component (e.g., display assembly 210) of NED 100. In alternate embodiments, the waveguide display 300 may constitute a part of some other NED, or other system that directs display image light to a particular location.

The waveguide display 300 may include a source assembly 310, an output waveguide 320, and a controller 330. For purposes of illustration, FIG. 3 shows the waveguide display 300 associated with a single eye 220, but in some embodiments, another waveguide display separate (or partially separate) from the waveguide display 300 may provide image light to another eye of the user. In a partially separate system, for instance, one or more components may be shared between waveguide displays for each eye.

The source assembly 310 generates image light. The source assembly 310 may include a source 340, a light conditioning assembly 360, and a scanning mirror assembly 370. The source assembly 310 may generate and output image light 345 to a coupling element 350 of the output waveguide 320.

The source 340 may include a source of light that generates at least a coherent or partially coherent image light 345. The source 340 may emit light in accordance with one or more illumination parameters received from the controller 330. The source 340 may include one or more source elements, including, but not restricted to light emitting diodes, such as micro-OLEDs, as described in detail below with reference to FIGS. 4-10.

The output waveguide 320 may be configured as an optical waveguide that outputs image light to an eye 220 of a user. The output waveguide 320 receives the image light 345 through one or more coupling elements 350 and guides the received input image light 345 to one or more decoupling elements 360. In some embodiments, the coupling element 350 couples the image light 345 from the source assembly 310 into the output waveguide 320. The coupling element 350 may be or include a diffraction grating, a holographic grating, some other element that couples the image light 345 into the output waveguide 320, or some combination thereof. For example, in embodiments where the coupling element 350 is a diffraction grating, the pitch of the diffraction grating may be chosen such that total internal reflection occurs, and the image light 345 propagates internally toward the decoupling element 360. For example, the pitch of the diffraction grating may be in the range of approximately 300 nm to approximately 600 nm.

The decoupling element 360 decouples the total internally reflected image light from the output waveguide 320. The decoupling element 360 may be or include a diffraction grating, a holographic grating, some other element that decouples image light out of the output waveguide 320, or some combination thereof. For example, in embodiments where the decoupling element 360 is a diffraction grating, the pitch of the diffraction grating may be chosen to cause incident image light to exit the output waveguide 320. An orientation and position of the image light exiting from the output waveguide 320 may be controlled by changing an orientation and position of the image light 345 entering the coupling element 350.

The output waveguide 320 may be composed of one or more materials that facilitate total internal reflection of the image light 345. The output waveguide 320 may be composed of, for example, silicon, glass, or a polymer, or some combination thereof. The output waveguide 320 may have a relatively small form factor such as for use in a head-mounted display. For example, the output waveguide 320 may be approximately 30 mm wide along an x-dimension, 50 mm long along a y-dimension, and 0.5-1 mm thick along a z-dimension. In some embodiments, the output waveguide 320 may be a planar (2D) optical waveguide.

The controller 330 may be used to control the scanning operations of the source assembly 310. In certain embodiments, the controller 330 may determine scanning instructions for the source assembly 310 based at least on one or more display instructions. Display instructions may include instructions to render one or more images. In some embodiments, display instructions may include an image file (e.g., bitmap). The display instructions may be received from, e.g., a console of a virtual reality system (not shown). Scanning instructions may include instructions used by the source assembly 310 to generate image light 345. The scanning instructions may include, e.g., a type of a source of image light (e.g. monochromatic, polychromatic), a scanning rate, an orientation of scanning mirror assembly 370, and/or one or more illumination parameters, etc. The controller 330 may include a combination of hardware, software, and/or firmware not shown here so as not to obscure other aspects of the disclosure.

According to some embodiments, source 340 may include a light emitting diode (LED), such as an organic light emitting diode (OLED). An organic light-emitting diode (OLED) is a light-emitting diode (LED) having an emissive electroluminescent layer that may include a thin film of an organic compound that emits light in response to an electric current. The organic layer is typically situated between a pair of conductive electrodes. One or both of the electrodes may be transparent.

As will be appreciated, an OLED display can be driven with a passive-matrix (PMOLED) or active-matrix (AMOLED) control scheme. In a PMOLED scheme, each row (and line) in the display may be controlled sequentially, whereas AMOLED control typically uses a thin-film transistor backplane to directly access and switch each individual pixel on or off, which allows for higher resolution and larger display areas.

Figure 4:
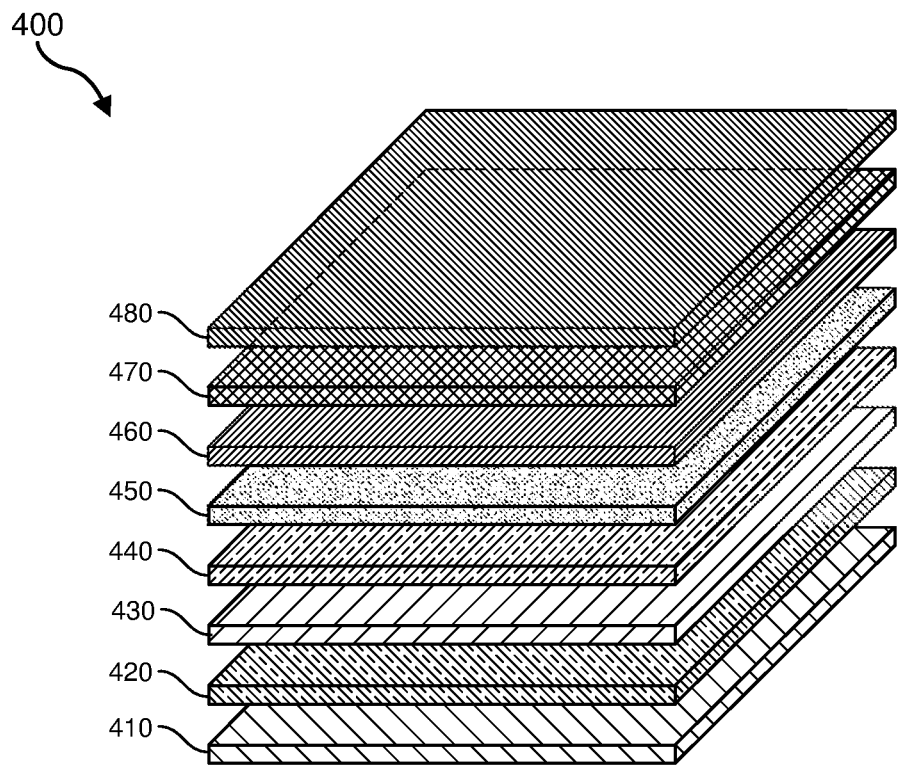
FIG. 4 depicts a simplified OLED structure according to some embodiments.

A simplified structure of an OLED according to some embodiments is depicted in FIG. 4. As shown in an exploded view, OLED 400 may include, from bottom to top, a substrate 410, anode 420, hole injection layer 430, hole transport layer 440, emissive layer 450, blocking layer 460, electron transport layer 470, and cathode 480. In some embodiments, substrate (or backplane) 410 may include single crystal or polycrystalline silicon or other suitable semiconductor (e.g., germanium).

Anode 420 and cathode 480 may include any suitable conductive material(s), such as transparent conductive oxides (TCOs, e.g., indium tin oxide (ITO), zinc oxide (ZnO), and the like). The anode 420 and cathode 480 are configured to inject holes and electrons, respectively, into one or more organic layer(s) within emissive layer 450 during operation of the device.

The hole injection layer 430, which is disposed over the anode 420, receives holes from the anode 420 and is configured to inject the holes deeper into the device, while the adjacent hole transport layer 440 may support the transport of holes to the emissive layer 450. The emissive layer 450 converts electrical energy to light. Emissive layer 450 may include one or more organic molecules, or light-emitting fluorescent dyes or dopants, which may be dispersed in a suitable matrix as known to those skilled in the art.

Blocking layer 460 may improve device function by confining electrons (charge carriers) to the emissive layer 450. Electron transport layer 470 may support the transport of electrons from the cathode 480 to the emissive layer 450.

In some embodiments, the generation of red, green, and blue light (to render full-color images) may include the formation of red, green, and blue OLED sub-pixels in each pixel of the display. Alternatively, the OLED 400 may be adapted to produce white light in each pixel. The white light may be passed through a color filter to produce red, green, and blue sub-pixels.

Any suitable deposition process(es) may be used to form OLED 400. For example, one or more of the layers constituting the OLED may be fabricated using physical vapor deposition (PVD), chemical vapor deposition (CVD), evaporation, spray-coating, spin-coating, atomic layer deposition (ALD), and the like. In further aspects, OLED 400 may be manufactured using a thermal evaporator, a sputtering system, printing, stamping, etc.

According to some embodiments, OLED 400 may be a micro-OLED. A "micro-OLED," in accordance with various examples, may refer to a particular type of OLED having a small active light emitting area (e.g., less than 2,000 $\mu m^2$ in some embodiments, less than 20 $\mu m^2$ or less than 10 $\mu m^2$ in other embodiments). In some embodiments, the emissive surface of the micro-OLED may have a diameter of less than approximately 2 $\mu m$. Such a micro-OLED may also have collimated light output, which may increase the brightness level of light emitted from the small active light emitting area.

Figure 5:
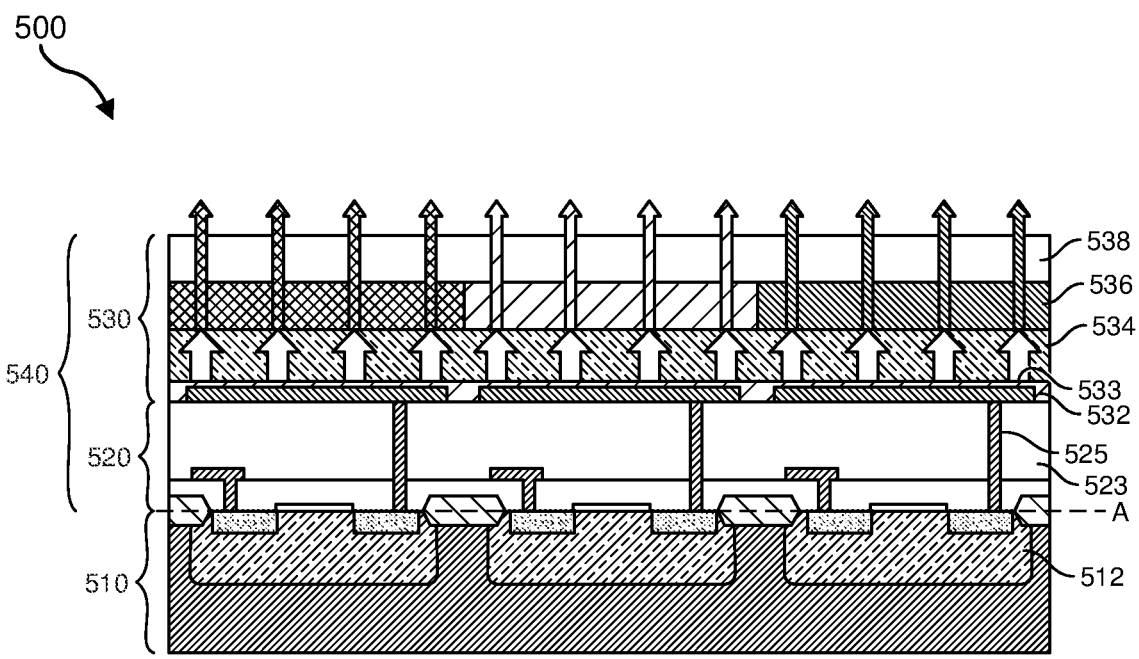
FIG. 5 is a schematic view of an OLED display architecture including a display driver integrated circuit (DDIC) mounted over a back face of a silicon backplane according to some embodiments.

An example OLED device is shown schematically in FIG. 5. According to some embodiments, OLED device 500 (e.g., micro-OLED chip) may include a display active area 530 having an active matrix 532 (such as OLED 400) disposed over a single crystal (e.g., silicon) backplane 520. The combined display/backplane architecture, i.e., display element 540 may be bonded (e.g., at or about interface A) directly or indirectly to a display driver integrated circuit (DDIC) 510. As illustrated, DDIC 510 may include an array of driving transistors 512, which may be formed using conventional CMOS processing as will be appreciated by those skilled in the art. One or more display driver integrated circuits may be formed over a single crystal (e.g., silicon) substrate.

In some embodiments, the display active area 530 may have at least one areal dimension (i.e., length or width) greater than approximately 1.3 inches, e.g., approximately 1.4, 1.5, 1.6, 1.7, 1.8, 1.9, 2.0, 2.25, 2.5, 2.75, or 3 inches, including ranges between any of the foregoing values, although larger area displays are contemplated.

Silicon backplane 520 may include a single crystal or polycrystalline silicon layer 523 having a through silicon via 525 for electrically connecting the DDIC 510 with the display active area 530. In some embodiments, display active area 530 may further include a transparent encapsulation layer 534 disposed over an upper emissive surface 533 of active matrix 532, a color filter 536, and cover glass 538.

According to various embodiments, the display active area 530 and underlying silicon backplane 520 may be manufactured separately from, and then later bonded to, DDIC 510, which may simplify formation of the OLED active area, including formation of the active matrix 532, color filter 536, etc.

The DDIC 510 may be directly bonded to a back face of the silicon backplane opposite to active matrix 532. In further embodiments, a chip-on-flex (COF) packaging technology may be used to integrate display element 540 with DDIC 510, optionally via a data selector (i.e., multiplexer) array (not shown) to form OLED device 500. As used herein, the terms "multiplexer" or "data selector" may, in some examples, refer to a device adapted to combine or select from among plural analog or digital input signals, which are transmitted to a single output. Multiplexers may be used to increase the amount of data that can be communicated within a certain amount of space, time, and bandwidth.

As used herein, "chip-on-flex" (COF) may, in some examples, refer to an assembly technology where a microchip or die, such as an OLED chip, is directly mounted on and electrically connected to a flexible circuit, such as a direct driver circuit. In a COF assembly, the microchip may avoid some of the traditional assembly steps used for individual IC packaging. This may simplify the overall processes of design and manufacture while improving performance and yield.

In accordance with certain embodiments, COF assembly may include attaching a die to a flexible substrate, electrically connecting the chip to the flex circuit, and encapsulating the chip and wires, e.g., using an epoxy resin to provide environmental protection. In some embodiments, the adhesive (not shown) used to bond the chip to the flex substrate may be thermally conductive or thermally insulating. In some embodiments, ultrasonic or thermosonic wire bonding techniques may be used to electrically connect the chip to the flex substrate.

Figure 6:
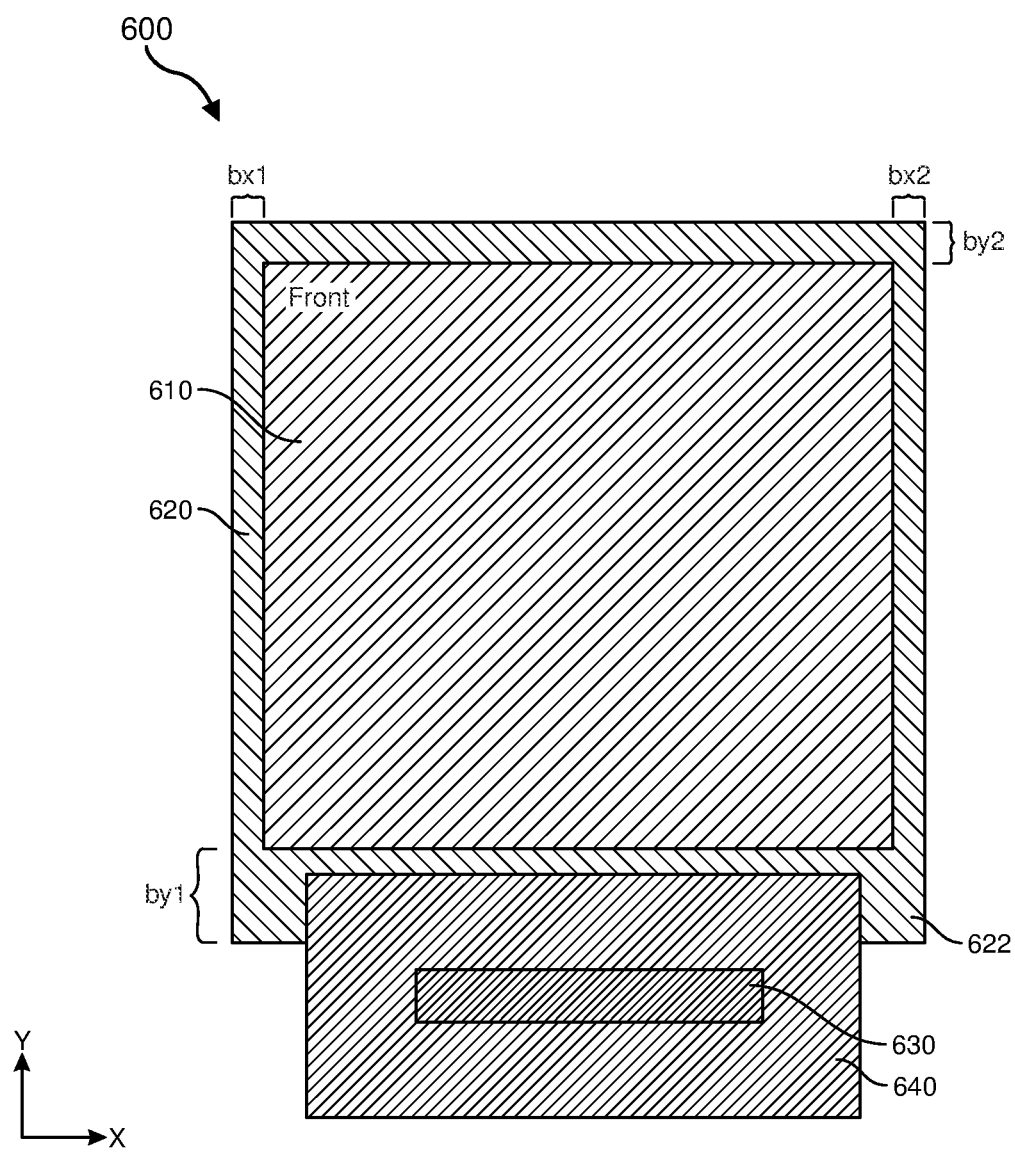
FIG. 6 is a schematic view of a comparative micro-OLED package showing a DDIC mounted to a front face of a silicon backplane adjacent to an active display panel.

Referring to FIG. 6, a comparative OLED device 600 includes a display panel 610 disposed over a front face of a silicon backplane 620 defining an active area and an inactive area peripheral to the active area. The active area may be configured to display an image. The inactive area is adjacent to the active area and does not display an image. Thus, all the pixels of the display panel 610 may be disposed within the active area, and not in the inactive area.

The inactive area of the silicon backplane 620 located peripheral to the active area may be referred to as a bezel. The bezel may have a width bx1 and a width bx2 at the left and right edges of OLED device 600 and may further be characterized by a width by1 and a width by2 at the bottom and top edges of the OLED device, respectively.

Device 600 further includes control circuitry 630 mounted on a flexible substrate 640 that is bonded to the silicon backplane 620 adjacent to display panel 610 within bezel region 622. Control circuitry 630 may include a display driver integrated circuit (DDIC), for example. In the illustrated comparative device 600, a portion of the flexible substrate 640 overlies the front face of the silicon backplane 620, i.e., within bezel region 622. Accordingly, the width by1 of bottom bezel region 622 may be greater than widths bx1, bx2, and by2 to accommodate bonding of the flexible substrate 640.

Figure 7A:
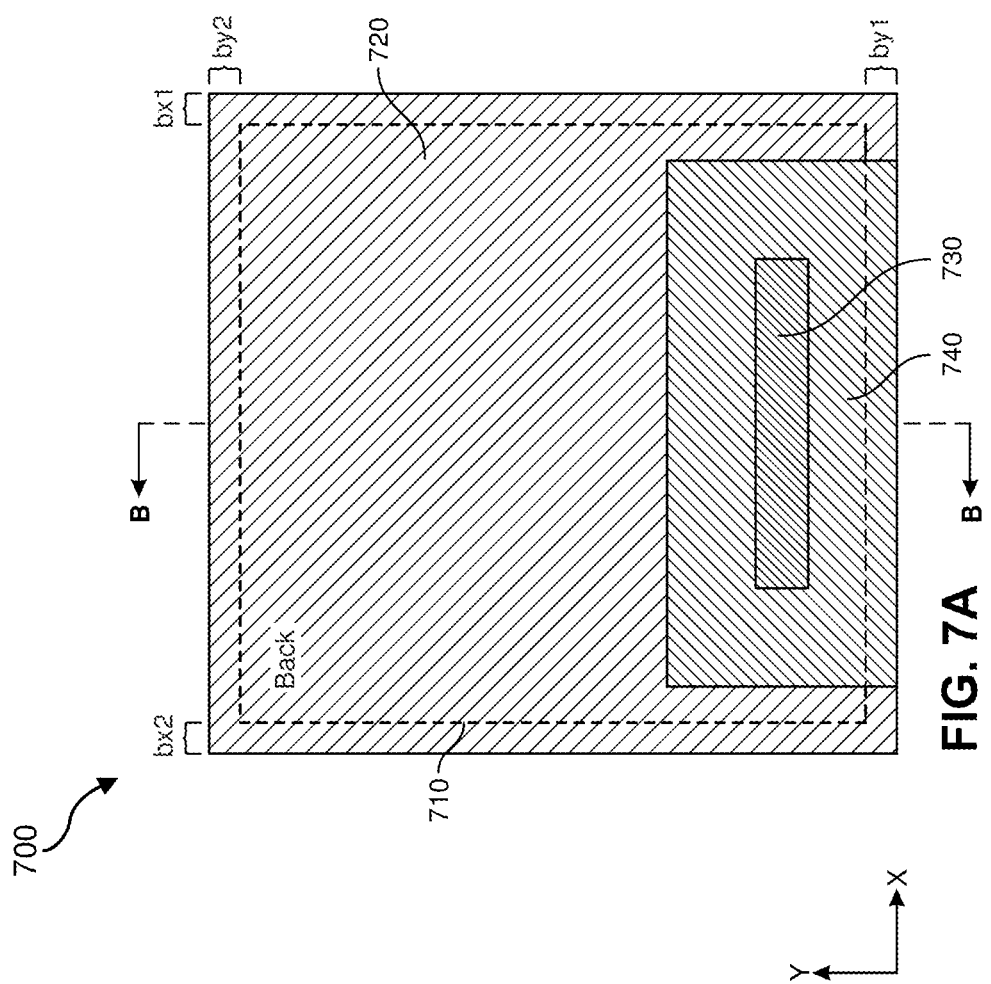
FIG. 7A is a schematic plan view of a micro-OLED package showing a DDIC mounted to a back face of a silicon backplane according to certain embodiments.

Referring to FIG. 7, shown is a schematic diagram of an OLED device layout according to various embodiments. OLED device 700, which is viewed in FIG. 7A from the backside, includes a display panel 710 disposed over a front face of silicon backplane 720. Control circuitry 730 may be mounted on a flexible substrate 740, which may be bonded to the back face of the silicon backplane 720. That is, a display driver integrated circuit 730 may be bonded to a flexible substrate 740 where the flexible substrate 740 is located between the display driver integrated circuit 730 and the silicon backplane 720.

Figure 7B:
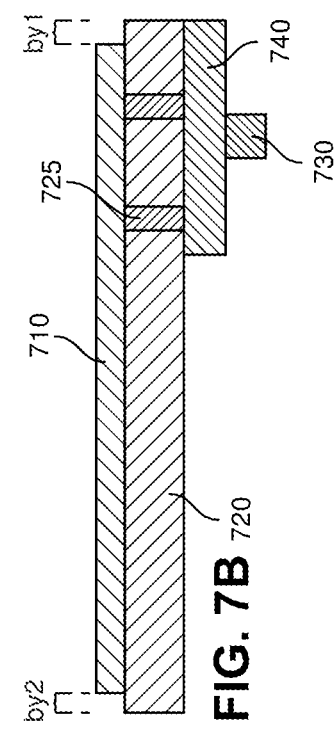
FIG. 7B is a cross-sectional view of the micro-OLED package of FIG. 7A showing the active display panel overlying the DDIC according to some embodiments.

A cross-sectional view along line B-B in FIG. 7A is shown in FIG. 7B. As shown in FIG. 7B, control circuitry 730 may be electrically connected to display panel 710 through conductive vias 725 that extend through silicon backplane 720. According to some embodiments, and in contrast to the comparative device 600 shown in FIG. 6, the silicon backplane 720 may overlie the entire display driver integrated circuit 730. According to some embodiments, the display active area 710 may overlie the entire display driver integrated circuit 730.

By placing control circuitry 730 and the associated flexible substrate 740 over the back face of the silicon backplane 720, the width by1 of bezel region 622 may be significantly decreased such that, in certain embodiments, a ratio of the area of the display panel 710 to the area of the silicon backplane 720 may be at least approximately 90%, e.g., approximately 90%, approximately 92%, approximately 94%, approximately 96%, or approximately 98%, including ranges between any of the foregoing values.

Figure 8:
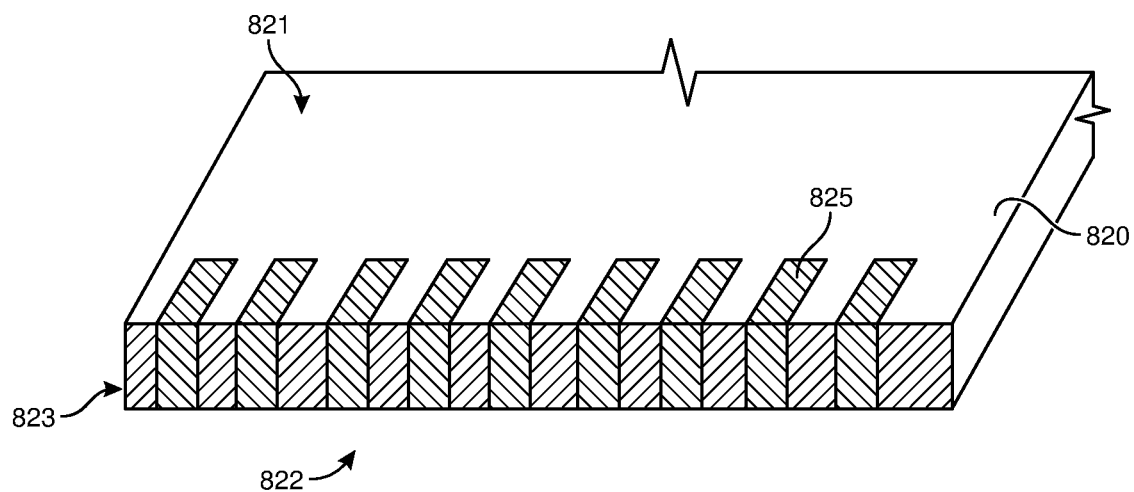
FIG. 8 is a perspective view showing a plurality of conductive vias extending through and exposed along a sidewall of a silicon backplane according to various embodiments.

The incorporation of example TSVs into a silicon backplane is illustrated in FIG. 8, where silicon backplane 820 includes a plurality of TSVs 825 extending from a front face 821 of the backplane 820 to a back face 822 of the backplane 820. In the instant embodiment, TSVs 825 may be additionally exposed along an edge 823, which may provide an additional degree of freedom for electrically connecting a backside-mounted DDIC to a display panel formed over the front side of the backplane.

Referring to FIG. 9, shown is a micro-OLED display package where various control circuit elements may be integrated into the display package via a back face connected DDIC. In the embodiment of FIG. 9, display 900 may include a DDIC 910 coupled, e.g., via a multiplexer (not shown) to silicon backplane 920. Each of a display active area 930, gate driver 950, and source driver 960 may be formed over the silicon backplane 920. In some embodiments, the gate driver 950 and the source driver 960 may be integrated through the backside of the silicon backplane 920. The back side mounted DDIC 910 may include I/O interface 970, MIPI receiver 972, timing controller 974, data processing element 976, and bias and reference voltage elements 978.

The MIPI (mobile industry processor interface) receiver 972 may be a MIPI display serial interface (DSO, which may include a high-speed packet-based interface for delivering video data to the display. Timing controller 974 may be configured to receive image data and convert the data format for the source drivers' input. Timing controller 974 may also be configured to generate control signals for the gate and source drivers 950, 960.

According to further embodiments, and with reference to FIG. 10, display 1000 may include a DDIC 1010 coupled, e.g., via a multiplexer (not shown) to silicon backplane 1020. Display active area 1030 and gate driver 1050 may be formed over the silicon backplane 1020, while source driver 1060 may be incorporated into the DDIC 1010 together with I/O interface 1070, MIPI receiver 1072, timing controller 1074, data processing element 1076, and bias and reference voltage elements 1078. Although shown mounted to the front side of the silicon backplane 1020, in certain embodiments, gate driver 1050 may be disposed over the back side of the silicon backplane and integrated using through silicon vias.

The instant disclosure relates to a micro-OLED structure including an active display panel formed over a silicon backplane and further including a DDIC having connections, relative to conventional devices, that are relocated to the back side of the silicon. The backside placement of the DDIC connections enables a greater percentage of the silicon's front face to be dedicated to the device active area, which may correlate to a significant improvement in material utilization and a potential for substantial cost savings. That is, the approach preserves front-side area of the chip for the device active area and thus enables a larger active area for a given chip size. In certain embodiments, chip-on-flex (COF) or direct bonding methods in conjunction with through silicon via (TSV) techniques may be used to secure and electrically connect the DDIC to the active display, i.e., through the silicon backplane. Based on a more efficient utilization of silicon, the invention may increase the number of harvested die per wafer by 25% or more.

EXAMPLE EMBODIMENTS

Example 1: A device may include a display element having a display active area disposed over a silicon backplane, and a display driver integrated circuit (DDIC) electrically coupled to the display element by a contact that extends through the silicon backplane.

Example 2: The device of Example 1, where the display active area includes a micro-OLED.

Example 3: The device of any of Examples 1 and 2, where the display active area overlies at least 90% of an area of the silicon backplane.

Example 4: The device of any of Examples 1-3, where the silicon backplane includes single crystal silicon.

Example 5: The device of any of Examples 1-4, where the silicon backplane completely overlies the display driver integrated circuit.

Example 6: The device of any of Examples 1-5, where the display active area completely overlies the display driver integrated circuit.

Example 7: The device of any of Examples 1-6, where the display driver integrated circuit is bonded to a flexible substrate and the flexible substrate is located between the display driver integrated circuit and the silicon backplane.

Example 8: The device of Example 7, where the flexible substrate is bonded to a surface of the silicon backplane opposite to the display element.

Example 9: The device of any of Examples 1-8, wherein the contact includes a metal.

Example 10: The device of any of Examples 1-9, where the contact extends entirely through the silicon backplane.

Example 11: The device of any of Examples 1-10, where the contact is exposed along a sidewall of the silicon backplane.

Example 12: The device of any of Examples 1-11, further including a plurality of pixel transistors disposed between the silicon backplane and the display element.

Example 13: The device of any of Examples 1-12, further including a multiplexer communicatively coupling the display element to the display driver integrated circuit.

Example 14: A display system includes a display element having an LED-containing display active area disposed over a silicon backplane, and a display driver integrated circuit (DDIC) electrically connected to the display active area by a through silicon via (TSV) that extends through the silicon backplane.

Example 15: The display system of Example 14, where the display active area includes a micro-OLED.

Example 16: The display system of any of Examples 14 and 15, where the display active area includes at least 90% of an area of the silicon backplane.

Example 17: The display system of any of Examples 14-16, where the display driver integrated circuit is disposed on a flexible substrate.

Example 18: A method includes (a) forming a display element including an LED-containing display active area over a silicon backplane, (b) forming a metallized via that extends entirely through the silicon backplane, and (c) forming a display driver integrated circuit (DDIC) over the silicon backplane opposite to the display element, where the display driver integrated circuit is electrically connected to the display active area through the metallized via.

Example 19: The method of Example 18, further including forming the display driver integrated circuit on a flexible substrate.

Example 20: The method of any of Examples 18 and 19, further including attaching the display driver integrated circuit to a flexible substrate, and bonding the flexible substrate to a surface of the silicon backplane opposite to the display element.

Embodiments of the present disclosure may include or be implemented in conjunction with various types of artificial-reality systems. Artificial reality is a form of reality that has been adjusted in some manner before presentation to a user, which may include, for example, a virtual reality, an augmented reality, a mixed reality, a hybrid reality, or some combination and/or derivative thereof. Artificial-reality content may include completely computer-generated content or computer-generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, for example, create content in an artificial reality and/or are otherwise used in (e.g., to perform activities in) an artificial reality.

Artificial-reality systems may be implemented in a variety of different form factors and configurations. Some artificial-reality systems may be designed to work without near-eye displays (NEDs). Other artificial-reality systems may include an NED that also provides visibility into the real world (e.g., augmented-reality system 1100 in FIG. 11) or that visually immerses a user in an artificial reality (e.g., virtual-reality system 1200 in FIG. 12). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 11:
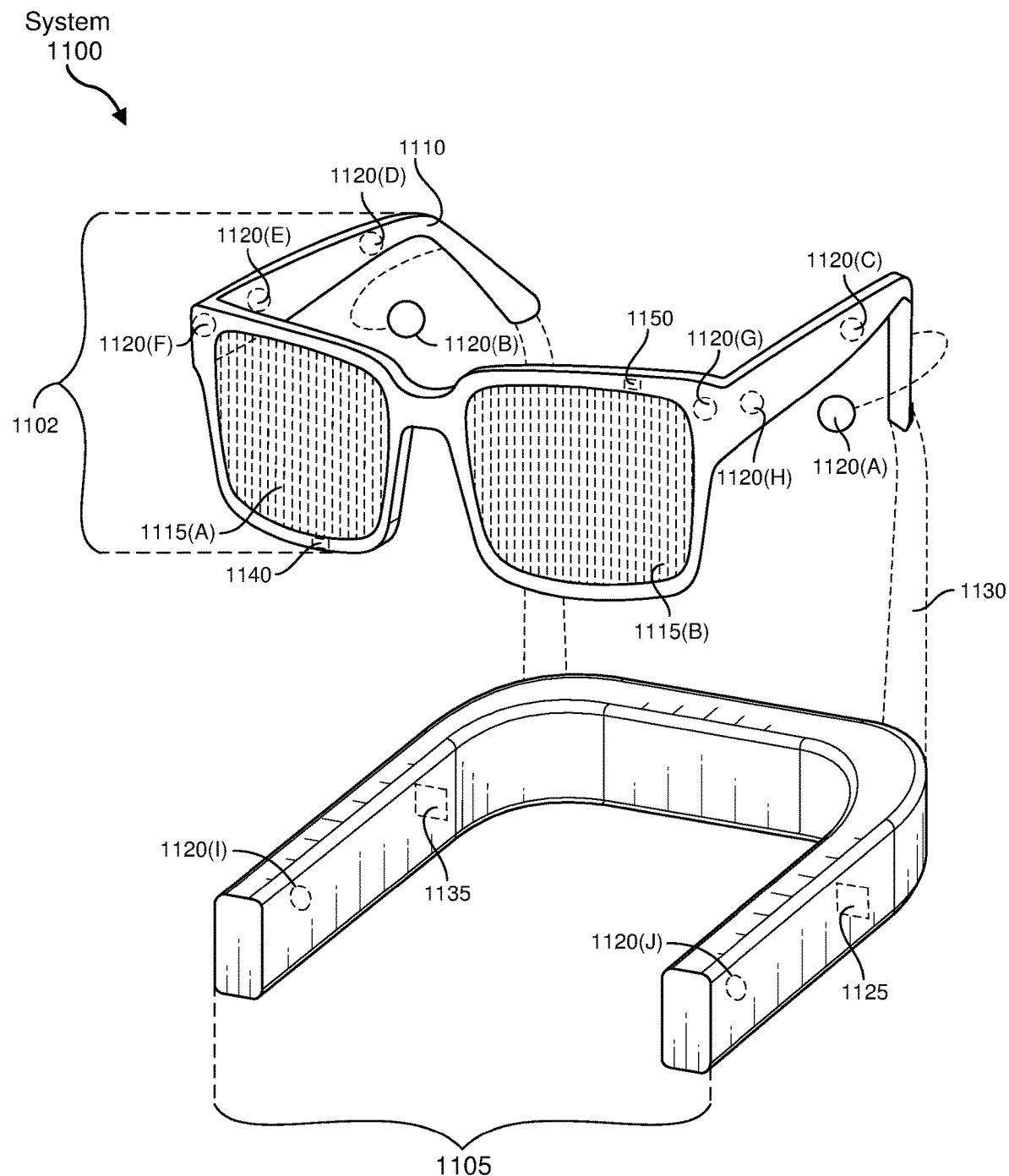
FIG. 11 is an illustration of exemplary augmented-reality glasses that may be used in connection with embodiments of this disclosure.
Figure 12:
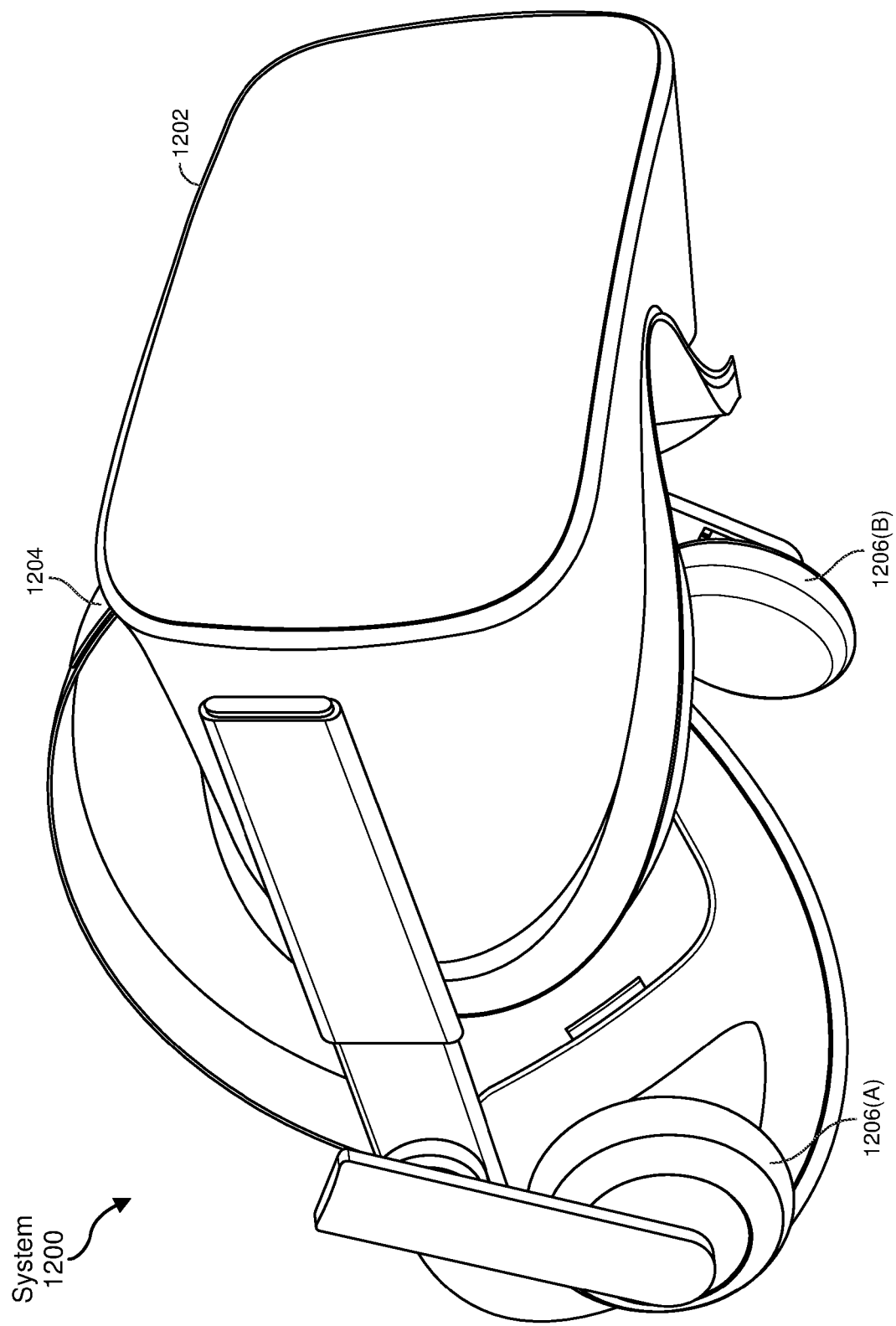
FIG. 12 is an illustration of an exemplary virtual-reality headset that may be used in connection with embodiments of this disclosure.

Turning to FIG. 11, augmented-reality system 1100 may include an eyewear device 1102 with a frame 1110 configured to hold a left display device 1115(A) and a right display device 1115(B) in front of a user's eyes. Display devices 1115(A) and 1115(B) may act together or independently to present an image or series of images to a user. While augmented-reality system 1100 includes two displays, embodiments of this disclosure may be implemented in augmented-reality systems with a single NED or more than two NEDs.

In some embodiments, augmented-reality system 1100 may include one or more sensors, such as sensor 1140. Sensor 1140 may generate measurement signals in response to motion of augmented-reality system 1100 and may be located on substantially any portion of frame 1110. Sensor 1140 may represent a position sensor, an inertial measurement unit (IMU), a depth camera assembly, a structured light emitter and/or detector, or any combination thereof. In some embodiments, augmented-reality system 1100 may or may not include sensor 1140 or may include more than one sensor. In embodiments in which sensor 1140 includes an IMU, the IMU may generate calibration data based on measurement signals from sensor 1140. Examples of sensor 1140 may include, without limitation, accelerometers, gyroscopes, magnetometers, other suitable types of sensors that detect motion, sensors used for error correction of the IMU, or some combination thereof.

Augmented-reality system 1100 may also include a microphone array with a plurality of acoustic transducers 1120(A)-1120(J), referred to collectively as acoustic transducers 1120. Acoustic transducers 1120 may be transducers that detect air pressure variations induced by sound waves. Each acoustic transducer 1120 may be configured to detect sound and convert the detected sound into an electronic format (e.g., an analog or digital format). The microphone array in FIG. 11 may include, for example, ten acoustic transducers: 1120(A) and 1120(B), which may be designed to be placed inside a corresponding ear of the user, acoustic transducers 1120(C), 1120(D), 1120(E), 1120(F), 1120(G), and 1120(H), which may be positioned at various locations on frame 1110, and/or acoustic transducers 1120(I) and 1120(J), which may be positioned on a corresponding neckband 1105.

In some embodiments, one or more of acoustic transducers 1120(A)-(F) may be used as output transducers (e.g., speakers). For example, acoustic transducers 1120(A) and/or 1120(B) may be earbuds or any other suitable type of headphone or speaker.

The configuration of acoustic transducers 1120 of the microphone array may vary. While augmented-reality system 1100 is shown in FIG. 11 as having ten acoustic transducers 1120, the number of acoustic transducers 1120 may be greater or less than ten. In some embodiments, using higher numbers of acoustic transducers 1120 may increase the amount of audio information collected and/or the sensitivity and accuracy of the audio information. In contrast, using a lower number of acoustic transducers 1120 may decrease the computing power required by an associated controller 1150 to process the collected audio information. In addition, the position of each acoustic transducer 1120 of the microphone array may vary. For example, the position of an acoustic transducer 1120 may include a defined position on the user, a defined coordinate on frame 1110, an orientation associated with each acoustic transducer 1120, or some combination thereof.

Acoustic transducers 1120(A) and 1120(B) may be positioned on different parts of the user's ear, such as behind the pinna, behind the tragus, and/or within the auricle or fossa. Or, there may be additional acoustic transducers 1120 on or surrounding the ear in addition to acoustic transducers 1120 inside the ear canal. Having an acoustic transducer 1120 positioned next to an ear canal of a user may enable the microphone array to collect information on how sounds arrive at the ear canal. By positioning at least two of acoustic transducers 1120 on either side of a user's head (e.g., as binaural microphones), augmented-reality device 1100 may simulate binaural hearing and capture a 3D stereo sound field around about a user's head. In some embodiments, acoustic transducers 1120(A) and 1120(B) may be connected to augmented-reality system 1100 via a wired connection 1130, and in other embodiments acoustic transducers 1120(A) and 1120(B) may be connected to augmented-reality system 1100 via a wireless connection (e.g., a Bluetooth connection). In still other embodiments, acoustic transducers 1120(A) and 1120(B) may not be used at all in conjunction with augmented-reality system 1100.

Acoustic transducers 1120 on frame 1110 may be positioned along the length of the temples, across the bridge, above or below display devices 1115(A) and 1115(B), or some combination thereof. Acoustic transducers 1120 may be oriented such that the microphone array is able to detect sounds in a wide range of directions surrounding the user wearing the augmented-reality system 1100. In some embodiments, an optimization process may be performed during manufacturing of augmented-reality system 1100 to determine relative positioning of each acoustic transducer 1120 in the microphone array.

In some examples, augmented-reality system 1100 may include or be connected to an external device (e.g., a paired device), such as neckband 1105. Neckband 1105 generally represents any type or form of paired device. Thus, the following discussion of neckband 1105 may also apply to various other paired devices, such as charging cases, smart watches, smart phones, wrist bands, other wearable devices, hand-held controllers, tablet computers, laptop computers, other external compute devices, etc.

As shown, neckband 1105 may be coupled to eyewear device 1102 via one or more connectors. The connectors may be wired or wireless and may include electrical and/or non-electrical (e.g., structural) components. In some cases, eyewear device 1102 and neckband 1105 may operate independently without any wired or wireless connection between them. While FIG. 11 illustrates the components of eyewear device 1102 and neckband 1105 in example locations on eyewear device 1102 and neckband 1105, the components may be located elsewhere and/or distributed differently on eyewear device 1102 and/or neckband 1105. In some embodiments, the components of eyewear device 1102 and neckband 1105 may be located on one or more additional peripheral devices paired with eyewear device 1102, neckband 1105, or some combination thereof.

Pairing external devices, such as neckband 1105, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 1100 may be provided by a paired device or shared between a paired device and an eyewear device, thus reducing the weight, heat profile, and form factor of the eyewear device overall while still retaining desired functionality. For example, neckband 1105 may allow components that would otherwise be included on an eyewear device to be included in neckband 1105 since users may tolerate a heavier weight load on their shoulders than they would tolerate on their heads. Neckband 1105 may also have a larger surface area over which to diffuse and disperse heat to the ambient environment. Thus, neckband 1105 may allow for greater battery and computation capacity than might otherwise have been possible on a stand-alone eyewear device. Since weight carried in neckband 1105 may be less invasive to a user than weight carried in eyewear device 1102, a user may tolerate wearing a lighter eyewear device and carrying or wearing the paired device for greater lengths of time than a user would tolerate wearing a heavy stand-alone eyewear device, thereby enabling users to more fully incorporate artificial-reality environments into their day-to-day activities.

Neckband 1105 may be communicatively coupled with eyewear device 1102 and/or to other devices. These other devices may provide certain functions (e.g., tracking, localizing, depth mapping, processing, storage, etc.) to augmented-reality system 1100. In the embodiment of FIG. 11, neckband 1105 may include two acoustic transducers (e.g., 1120(I) and 1120(J)) that are part of the microphone array (or potentially form their own microphone subarray). Neckband 1105 may also include a controller 1125 and a power source 1135.

Acoustic transducers 1120(I) and 1120(J) of neckband 1105 may be configured to detect sound and convert the detected sound into an electronic format (analog or digital). In the embodiment of FIG. 11, acoustic transducers 1120(I) and 1120(J) may be positioned on neckband 1105, thereby increasing the distance between the neckband acoustic transducers 1120(I) and 1120(J) and other acoustic transducers 1120 positioned on eyewear device 1102. In some cases, increasing the distance between acoustic transducers 1120 of the microphone array may improve the accuracy of beamforming performed via the microphone array. For example, if a sound is detected by acoustic transducers 1120(C) and 1120(D) and the distance between acoustic transducers 1120(C) and 1120(D) is greater than, e.g., the distance between acoustic transducers 1120(D) and 1120(E), the determined source location of the detected sound may be more accurate than if the sound had been detected by acoustic transducers 1120(D) and 1120(E).

Controller 1125 of neckband 1105 may process information generated by the sensors on neckband 1105 and/or augmented-reality system 1100. For example, controller 1125 may process information from the microphone array that describes sounds detected by the microphone array. For each detected sound, controller 1125 may perform a direction-of-arrival (DOA) estimation to estimate a direction from which the detected sound arrived at the microphone array. As the microphone array detects sounds, controller 1125 may populate an audio data set with the information. In embodiments in which augmented-reality system 1100 includes an inertial measurement unit, controller 1125 may compute all inertial and spatial calculations from the IMU located on eyewear device 1102. A connector may convey information between augmented-reality system 1100 and neckband 1105 and between augmented-reality system 1100 and controller 1125. The information may be in the form of optical data, electrical data, wireless data, or any other transmittable data form. Moving the processing of information generated by augmented-reality system 1100 to neckband 1105 may reduce weight and heat in eyewear device 1102, making it more comfortable to the user.

Power source 1135 in neckband 1105 may provide power to eyewear device 1102 and/or to neckband 1105. Power source 1135 may include, without limitation, lithium ion batteries, lithium-polymer batteries, primary lithium batteries, alkaline batteries, or any other form of power storage. In some cases, power source 1135 may be a wired power source. Including power source 1135 on neckband 1105 instead of on eyewear device 1102 may help better distribute the weight and heat generated by power source 1135.

As noted, some artificial-reality systems may, instead of blending an artificial reality with actual reality, substantially replace one or more of a user's sensory perceptions of the real world with a virtual experience. One example of this type of system is a head-worn display system, such as virtual-reality system 1200 in FIG. 12, that mostly or completely covers a user's field of view. Virtual-reality system 1200 may include a front rigid body 1202 and a band 1204 shaped to fit around a user's head. Virtual-reality system 1200 may also include output audio transducers 1206(A) and 1206(B). Furthermore, while not shown in FIG. 12, front rigid body 1202 may include one or more electronic elements, including one or more electronic displays, one or more inertial measurement units (IMUS), one or more tracking emitters or detectors, and/or any other suitable device or system for creating an artificial reality experience.

Artificial-reality systems may include a variety of types of visual feedback mechanisms. For example, display devices in augmented-reality system 1100 and/or virtual-reality system 1200 may include one or more liquid crystal displays (LCDs), light emitting diode (LED) displays, organic LED (OLED) displays, digital light project (DLP) micro-displays, liquid crystal on silicon (LCoS) micro-displays, and/or any other suitable type of display screen. Artificial-reality systems may include a single display screen for both eyes or may provide a display screen for each eye, which may allow for additional flexibility for varifocal adjustments or for correcting a user's refractive error. Some artificial-reality systems may also include optical subsystems having one or more lenses (e.g., conventional concave or convex lenses, Fresnel lenses, adjustable liquid lenses, etc.) through which a user may view a display screen. These optical subsystems may serve a variety of purposes, including to collimate (e.g., make an object appear at a greater distance than its physical distance), to magnify (e.g., make an object appear larger than its actual size), and/or to relay (to, e.g., the viewer's eyes) light. These optical subsystems may be used in a non-pupil-forming architecture (such as a single lens configuration that directly collimates light but results in so-called pincushion distortion) and/or a pupil-forming architecture (such as a multi-lens configuration that produces so-called barrel distortion to nullify pincushion distortion).

In addition to or instead of using display screens, some artificial-reality systems may include one or more projection systems. For example, display devices in augmented-reality system 1100 and/or virtual-reality system 1200 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial-reality content and the real world. The display devices may accomplish this using any of a variety of different optical components, including waveguide components (e.g., holographic, planar, diffractive, polarized, and/or reflective waveguide elements), light-manipulation surfaces and elements (such as diffractive, reflective, and refractive elements and gratings), coupling elements, etc. Artificial-reality systems may also be configured with any other suitable type or form of image projection system, such as retinal projectors used in virtual retina displays.

Artificial-reality systems may also include various types of computer vision components and subsystems. For example, augmented-reality system 1100 and/or virtual-reality system 1200 may include one or more optical sensors, such as two-dimensional (2D) or 3D cameras, structured light transmitters and detectors, time-of-flight depth sensors, single-beam or sweeping laser rangefinders, 3D LiDAR sensors, and/or any other suitable type or form of optical sensor. An artificial-reality system may process data from one or more of these sensors to identify a location of a user, to map the real world, to provide a user with context about real-world surroundings, and/or to perform a variety of other functions.

Artificial-reality systems may also include one or more input and/or output audio transducers. In the examples shown in FIG. 12, output audio transducers 1206(A) and 1206(B) may include voice coil speakers, ribbon speakers, electrostatic speakers, piezoelectric speakers, bone conduction transducers, cartilage conduction transducers, tragus-vibration transducers, and/or any other suitable type or form of audio transducer. Similarly, input audio transducers may include condenser microphones, dynamic microphones, ribbon microphones, and/or any other type or form of input transducer. In some embodiments, a single transducer may be used for both audio input and audio output.

While not shown in FIG. 11, artificial-reality systems may include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial-reality devices, within other artificial-reality devices, and/or in conjunction with other artificial-reality devices.

By providing haptic sensations, audible content, and/or visual content, artificial-reality systems may create an entire virtual experience or enhance a user's real-world experience in a variety of contexts and environments. For instance, artificial-reality systems may assist or extend a user's perception, memory, or cognition within a particular environment. Some systems may enhance a user's interactions with other people in the real world or may enable more immersive interactions with other people in a virtual world. Artificial-reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visual aids, etc.). The embodiments disclosed herein may enable or enhance a user's artificial-reality experience in one or more of these contexts and environments and/or in other contexts and environments.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to any claims appended hereto and their equivalents in determining the scope of the present disclosure.

Unless otherwise noted, the terms "connected to" and "coupled to" (and their derivatives), as used in the specification and/or claims, are to be construed as permitting both direct and indirect (i.e., via other elements or components) connection. In addition, the terms "a" or "an," as used in the specification and/or claims, are to be construed as meaning "at least one of." Furthermore, for ease of use, the terms "including" and "having" (and their derivatives), as used in the specification and/or claims, are interchangeable with and have the same meaning as the word "comprising."

It will be understood that when an element such as a layer or a region is referred to as being formed on, deposited on, or disposed "on" or "over" another element, it may be located directly on at least a portion of the other element, or one or more intervening elements may also be present. In contrast, when an element is referred to as being "directly on" or "directly over" another element, it may be located on at least a portion of the other element, with no intervening elements present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a backplane that comprises or includes silicon include embodiments where a backplane consists essentially of silicon and embodiments where a backplane consists of silicon.

What is claimed is:

1. A device comprising:
   a display element having a display active area disposed over a front face of a silicon backplane; and
   a display driver integrated circuit (DDIC), formed on a substrate layer, such that:
      the DDIC is formed on a first surface of the substrate layer;
      an opposing face of the substrate layer that is opposite the first surface of the substrate layer is coupled to a rear face of the silicon backplane such that the silicon backplane overlies the entirety of the display driver integrated circuit; and
      the DDIC is electronically coupled to the display element by at least one contact that extends through a portion of the silicon backplane that is disposed between the display active area and the display driver integrated circuit.

2. The device of claim 1, wherein the display active area completely overlies the display driver integrated circuit.

3. The device of claim 1, wherein the display active area comprises a micro-OLED.

4. The device of claim 1, wherein the display active area comprises at least 90% of an area of the silicon backplane.

5. The device of claim 1, wherein the silicon backplane comprises single crystal silicon.

6. The device of claim 1, wherein the substrate layer comprises a flexible substrate.

7. The device of claim 6, wherein the flexible substrate is bonded to a surface of the silicon backplane opposite to the display element.

8. The device of claim 1, wherein the contact comprises a metal.

9. The device of claim 1, further comprising a plurality of pixel transistors disposed between the silicon backplane and the display element.

10. The device of claim 1, further comprising a multiplexer communicatively coupling the display element to the display driver integrated circuit.

11. The device of claim 1, wherein the silicon backplane is coupled to the DDIC using a chip-on-flex assembly.

12. The device of claim 11, further comprising an environmental protection layer that encapsulates the DDIC.

13. The device of claim 12, wherein the environmental protection layer comprises a thermally conductive compound.

14. A display system comprising:
   a display device comprising:
      a display element having a display active area disposed over a front face of a silicon backplane;
      a display driver integrated circuit (DDIC), formed on a substrate layer, such that:
         the DDIC is formed on a first surface of the substrate layer;
         an opposing face of the substrate layer that is opposite the first surface of the substrate layer is coupled to a rear face of the silicon backplane such that the silicon backplane overlies the entirety of the display driver integrated circuit; and
         the DDIC is electronically coupled to the display element by at least one contact that extends through a portion of the silicon backplane that is disposed between the display active area and the display driver integrated circuit; and
   a frame that is configured to hold the display device in front of a user's eye.

15. The display system of claim 14, wherein the display active area completely overlies the display driver integrated circuit.

16. The display system of claim 14, wherein the display active area comprises a micro-OLED.

17. The display system of claim 14, wherein the display active area comprises at least 90% of an area of the silicon backplane.

18. The display system of claim 14, wherein the silicon backplane comprises single crystal silicon.

19. The display system of claim 14, wherein the display driver integrated circuit is bonded to a flexible substrate and the flexible substrate is located between the display driver integrated circuit and the silicon backplane.

20. A method comprising:
  forming at least one metallized via that extends entirely through a silicon backplane;
  forming a display element comprising an LED-containing display active area over a front face of the silicon backplane such that the display element is electronically coupled to and overlies the at least one metallized via; and
  forming a display driver integrated circuit (DDIC) over a rear face of the silicon backplane such that:
    the DDIC is formed on a first surface of a substrate layer;
    an opposing face of the substrate layer that is opposite the first surface of the substrate layer is coupled to the silicon backplane such that the silicon backplane overlies the entirety of the display driver integrated circuit;
    the at least one metallized via is disposed between the display element and the DDIC; and
    the DDIC is electronically coupled to the display element by the at least one metallized via.

* * * * *